US010535601B2

(12) United States Patent
Hourani et al.

(10) Patent No.: US 10,535,601 B2
(45) Date of Patent: Jan. 14, 2020

(54) VIA BLOCKING LAYER

(71) Applicant: Intel Corporation, Santa Clara, CA (US)

(72) Inventors: Rami Hourani, Portland, OR (US); Marie Krysak, Portland, OR (US); Florian Gstrein, Portland, OR (US); Ruth A. Brain, Portland, OR (US); Mark T. Bohr, Aloha, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/302,692

(22) PCT Filed: Jun. 22, 2016

(86) PCT No.: PCT/US2016/038686
§ 371 (c)(1),
(2) Date: Nov. 19, 2018

(87) PCT Pub. No.: WO2017/222515
PCT Pub. Date: Dec. 28, 2017

(65) Prior Publication Data
US 2019/0122982 A1    Apr. 25, 2019

(51) Int. Cl.
*H01L 23/522*    (2006.01)
*H01L 21/768*    (2006.01)
(Continued)

(52) U.S. Cl.
CPC .... *H01L 23/5226* (2013.01); *H01L 21/02172* (2013.01); *H01L 21/76224* (2013.01);
(Continued)

(58) Field of Classification Search
CPC ......... H01L 21/76807; H01L 21/76813; H01L 21/76829; H01L 21/76834; H01L 21/76877; H01L 23/5226
See application file for complete search history.

(56) References Cited

U.S. PATENT DOCUMENTS

2004/0113190 A1    6/2004  Oh et al.
2006/0040501 A1    2/2006  America et al.
(Continued)

OTHER PUBLICATIONS

The International Searching Authority, Written Opinion of the International Searching Authority and the International Search Report dated Mar. 20, 2017 in International Application No. PCT/US2016/038686, 14 pages.

*Primary Examiner* — Daniel P Shook
(74) *Attorney, Agent, or Firm* — Trop, Pruner & Hu, P.C.

(57) ABSTRACT

An embodiment includes an apparatus comprising: a metal layer comprising a plurality of interconnect lines on a plurality of vias; an additional metal layer comprising first, second, and third interconnect lines on first, second, and third vias; the first and third vias coupling the first and third interconnect lines to two of the plurality of interconnect lines; a lateral interconnect, included entirely within the additional metal layer, directly connected to each of the first, second, and third interconnect lines; and an insulator layer included entirely between two sidewalls of the second via. Other embodiments are described herein.

20 Claims, 12 Drawing Sheets

(51) Int. Cl.
*H01L 21/02* (2006.01)
*H01L 21/762* (2006.01)
*H01L 21/8234* (2006.01)

(52) U.S. Cl.
CPC .. *H01L 21/76807* (2013.01); *H01L 21/76816* (2013.01); *H01L 21/76831* (2013.01); *H01L 21/823475* (2013.01)

(56) References Cited

U.S. PATENT DOCUMENTS

2007/0158714 A1* 7/2007 Eshun ............... H01L 21/76895
 257/295
2010/0038743 A1 2/2010 Lee
2011/0049618 A1 3/2011 Lee et al.

* cited by examiner

Ligand Mixture

US 10,535,601 B2

VIA BLOCKING LAYER

TECHNICAL FIELD

Embodiments of the invention are in the field of semiconductor devices and, in particular, interconnects.

BACKGROUND

In the manufacture of integrated circuits, interconnects are generally formed on a semiconductor substrate using a copper dual damascene process. Such a process typically begins with a trench being etched into a dielectric layer and then filled with a barrier/adhesion layer and a seed layer using a physical vapor deposition (PVD) sputtering process. An electroplating process is then used to fill the via and trench with copper metal to form the interconnect. However, as device dimensions scale down and the features become narrower, the aspect ratio of the features becomes more aggressive. Typically, there is a plurality of vias within a given layer of an integrated circuit structure. Vias in one area of the structure can be connected to vias or interconnects in other areas of the structure by routing through one or more subsequent dielectric layers.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
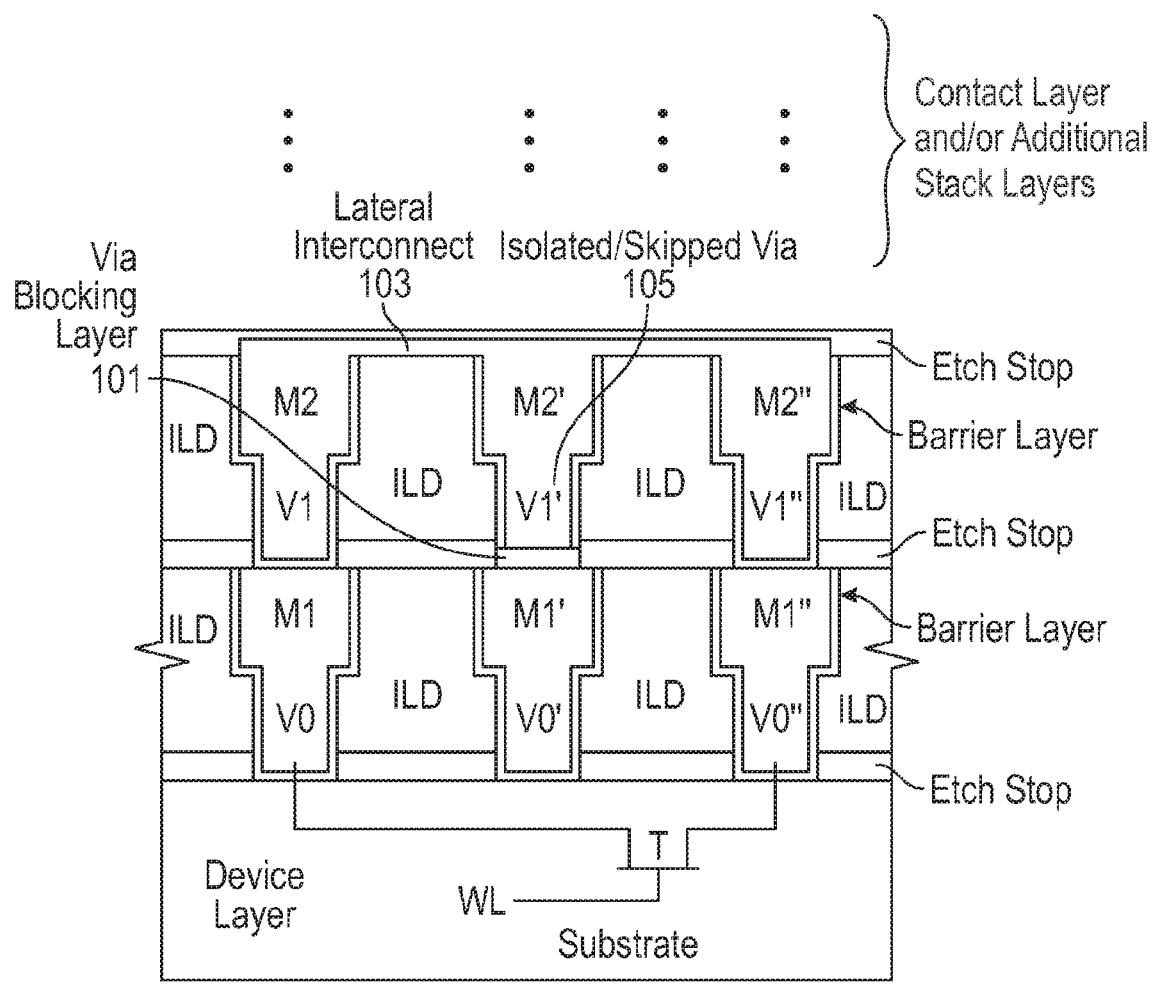
FIG. 1 illustrates an integrated circuit structure configured in accordance with an embodiment of the present disclosure.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Techniques are disclosed for insulating or electrically isolating select vias within a given interconnect layer, so a conductive routing can skip over those select isolated vias to reach other vias or interconnects in that same layer. Such a via blocking layer may be selectively implemented in any number of locations within a given interconnect as needed. An embodiment for forming a via blocking layer includes a selective passivation of trench sidewalls followed by a selective deposition of insulator material to cover the metal at the bottom of the trench. The passivation layer is sacrificial in nature, in that it is removed after the insulator material is deposited, and can be implemented with any materials that will block or otherwise inhibit the subsequent deposition of insulator material from adhering to the trench sidewalls. An embodiment for forming a via blocking layer includes the use of wet-recessible insulator materials that effectively restrict the presence of those materials to metal at the bottom of the trench. In one such case, the insulator materials are formed by an etch-free wet recess of polymeric materials that can be turned into a smooth dielectric film upon curing, to provide the via blocking layer. In another such case, the insulator materials for the via blocking layer are formed by suspending a dielectric nanoparticles solution in an organic solvent. These particles can be controllably spin-coated and restricted to the bottom of the trench with desired thickness and eventually converted to a smooth insulating dielectric film upon curing, to provide the via blocking layer.

As previously explained, in a typical interconnect structure there is a plurality of vias within each dielectric layer, or so-called interlayer dielectric (ILD) layer. Traditionally, vias in one area of a given layer can be electrically connected to vias or interconnects in other areas of that same layer by routing through one or more subsequent dielectric layers. Such multilayer routing tends to increase the thickness of the integrated circuit structure and further involves additional complicated processing steps. To this end, there is a need for interconnect routing options.

Thus, and in accordance with an embodiment of the present disclosure, techniques are provided for insulating or electrically isolating select vias within a given ILD layer, so a conductive routing can skip over those select isolated vias to reach other vias or interconnects in that same ILD layer. Normally, such lateral conductive interconnection is not possible, as unintended shorting between non-isolated vias would occur. Thus, and as will be appreciated in light of this disclosure, the techniques provided herein allow for more routing options within each ILD layer of a given interconnect structure. The selectively applied insulator layer can be implemented, for example, as a relatively thin, patterned electrically insulating dielectric film. The selectively applied insulating layer can generally be thought of as an inverse via connect or an anti-via or a via blocking layer. For purposes of simplicity, going forward, such an insulating layer is referred to herein as a via blocking layer.

The via blocking layer may be implemented in any number of locations within a given interconnect as needed. For instance, the via blocking layer can be provided between a given source/drain (S/D) contact and the local interconnect. In a more general sense, one or more intervening vias can be electrically isolated with such a via blocking layer so that two outer vias within that same layer can be electrically connected by way of a lateral conductive interconnect that runs through the intervening but electrically isolated vias. So, even though the intervening via metal may be in contact with the lateral conductive interconnect, the intervening vias themselves are electrically open-circuited by operation of the via blocking layer. Numerous other uses and configurations will be apparent in light of this disclosure. As will be further appreciated in light of this disclosure, by allowing vias in a given ILD layer to be bypassed or skipped over or otherwise electrically isolated, routing within that ILD layer can be more orthogonal to the gate direction (OGD), and more parallel to the gate direction (PGD). Such orthogonality is particularly helpful in layers above the local interconnect (sometimes referred to as M0 and M1), such as layers M2, M3, and so on, depending on the device architecture. This in turn allows for more inter-cell (PGD) and intra-cell (OGD) routing resources and flexibility, and greatly increases the block density.

As will be further appreciated in light of this disclosure, it would be very difficult to pattern or deposit a via blocking layer in a specific location within the interconnect using traditional techniques such as conformal deposition followed by lithography and etch steps. For instance, the etch requirements of such traditional processes are relatively harsh and can damage other components. Moreover, the conformal deposition on the trench walls increases the difficulty of subsequent gap fills due to increased aspect ratio. To this end, and in accordance with an embodiment, a methodology is provided herein that allows metal at the bottom of a given trench to be selectively capped or otherwise covered with a layer of insulator material (or anti-via or inverse via), and without corrupting the sidewalls of the trench with insulator material. The metal subsequently provided in the via and upper trench is therefore electrically isolated from the underlying metal. Hence, the selectively provisioned insulator material is referred to as a via blocking layer.

An embodiment for depositing insulator material in locations where a via blocking layer is desired includes a selective passivation of trench sidewalls followed by a selective atomic layer deposition (ALD) of insulator material into the bottom of the trench. In some such embodiments, the selective passivation is selectively applied to the trench sidewalls only. In other embodiments, the selective passivation is applied to both the trench sidewalls and the bottom, but then selectively removed from the trench bottom. In any such cases, the passivation layer is sacrificial in nature, in that it is removed after the insulator material is deposited, and can be implemented with any materials that will block the subsequent deposition of insulator material from adhering to the trench sidewalls. In accordance with an example embodiment, the sacrificial passivation layer is achieved by selectively passivating only the dielectrics using self-assembled monolayers (SAMs). As will be appreciated in light of this disclosure, such an approach blocks ALD deposition on the dielectrics (trench sidewalls) but maintains deposition of a smooth insulating film on the metal (trench bottom). The insulator material can be, for instance, a high-k dielectric material, in some embodiments. Other embodiments may use any suitable insulator materials, such as silicon dioxide. While the thickness of via blocking layers formed in this manner (e.g., using a sacrificial passivation to protect sidewalls and a high-k dielectric for the via blocking layer) can vary from one embodiment to the next and will depend on factors such as the dielectric constant of the insulator material used and the current/voltage profile associated with the particular node of the interconnect or integrated circuit being fabricated, in some such example embodiments, the thickness of the via blocking layer is in the range of 2-3 nm.

An embodiment for depositing insulator material in locations where a via blocking layer is desired includes the use of wet-recessible dielectrics that restrict the presence of that dielectric material to the bottom of the trench, on the metal to be insulated or otherwise electrically isolated. In one such case, the insulator materials are formed by an etch-free wet recess of polymeric materials that can eventually be turned into a smooth dielectric film upon curing, to provide the via blocking layer. In another such case, the insulator materials for the via blocking layer are formed by suspending metal oxide nanoparticles solution in an organic solvent. These particles can be controllably spin-coated and restricted to the bottom of the trench with desired thickness and eventually converted to a smooth insulating dielectric film upon curing, to provide the via blocking layer. While the thickness of via blocking layers formed in this manner (e.g., using spin-coating of polymeric or nanoparticle formulations for the via blocking layer) can vary from one embodiment to the next and will depend on factors such as the insulator material used and the current/voltage profile associated with that particular circuit node, in some such example embodiments, the thickness of the via blocking layer is in the range of 5-10 nm.

Thus, techniques are provided for constructing via blocking layers in desired locations without the need for conformal deposition thereby eliminating aggressive etch processes, in accordance with an embodiment. The techniques also prevent deposition on the trench sidewalls that results in a higher aspect ratio which in turn makes metal fill more difficult (such as the case where fill metal deposition causes pinch-off at top of trench, thereby leaving an unfilled void in trench bottom). Numerous configurations and embodiments will be apparent in light of this disclosure.

FIG. 1 illustrates an integrated circuit structure configured in accordance with an embodiment of the present disclosure. As can be seen, the structure includes a device layer and a number of ILD layers each having metal features therein. The structure might be, for example, a memory such as dynamic random access memory (DRAM). As can be seen, the device layer of the substrate is configured with various memory cell components integrated therein, such as access transistor T and word line WL. Such memory devices typically include a plurality of bit cells, with each cell generally including a storage capacitor communicatively coupled to a bitline by way of an access transistor that is gated by a word line. Other typical memory components and features not shown can also be included (e.g., row and column select circuitry, sense circuitry, power select circuitry, etc).

Each ILD layer includes various metal lines (M1, M1', and M1', M2, M2', and M2") and corresponding vias (V0, V0', V0", V1, V1', and V1") formed within the dielectric material. Note that the layout shown is not intended to implicate any particular feature spacing or density. Rather, this layout is simply an arbitrary example, and any number of layout designs can benefit from an embodiment of the present disclosure, where via blocking layers are formed as described herein. Each ILD layer in this example structure is generally isolated or otherwise demarcated from neighboring layers by an etch stop layer, as is sometimes done. In addition, each metal line and via of this example embodiment is configured with a barrier layer to prevent migration of metal into the ILD. Other embodiments may include fewer or more such layers (e.g., barrier layers, adhesion layers, and/or liners).

In this particular example embodiment, via V1' is electrically isolated from the underlying metal line M1' by via blocking layer 101. Hence, via V1' is further designated as isolated/skipped via 105. As explained herein, the blocking layer 101 is an insulator layer that breaks the electrical contact between a via and its neighboring conductor so as to allow that particular via to be skipped over. So, in this example configuration shown in FIG. 1, the lateral interconnect 103 electrically connects metal line M2 to metal line M2" by passing over (or through, as the case may be) metal line M2', which is electrically isolated by operation of the isolated/skipped via 105. Note that metal line M2' can still be filled with metal and processed like all the other metal lines, even though it will be electrically isolated from the underlying circuit. Likewise, note that the lateral interconnect 103 may effectively pass directly through or otherwise be in conductive contact with metal line M2'.

As will be appreciated, such via blocking layers 101 can be provided in any part of a given interconnect structure, and the present disclosure is not intended to be limited to any particular location. As will be further appreciated, a via blocking layer 101 as provided herein may have any number of shapes and profiles and need not be planar. Rather, in other embodiments, the via blocking layer 101 may be non-planar and include vertical sections, horizontal sections, diagonal sections, and/or rounded or curved sections. Nor do the via blocking layers 101 need to have a uniform thickness through its entire length. To this end, via blocking layers 101 can be formed with any number of profiles, shapes, and geometries, so long as they provide the electrical insulating/isolating effect so that the corresponding conductor can be skipped over without causing a short circuit or faulty operation of the integrated circuitry. Numerous routing schemes are thus possible.

Figure 2A:
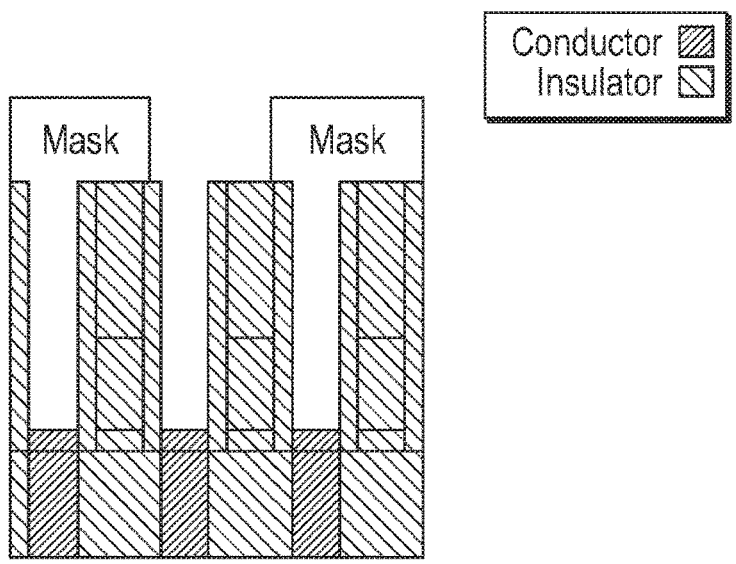
FIGS. 2a-c illustrate various process details for forming a via blocking layer using selective deposition, in accordance with an embodiment of the present disclosure.
Figure 2B:
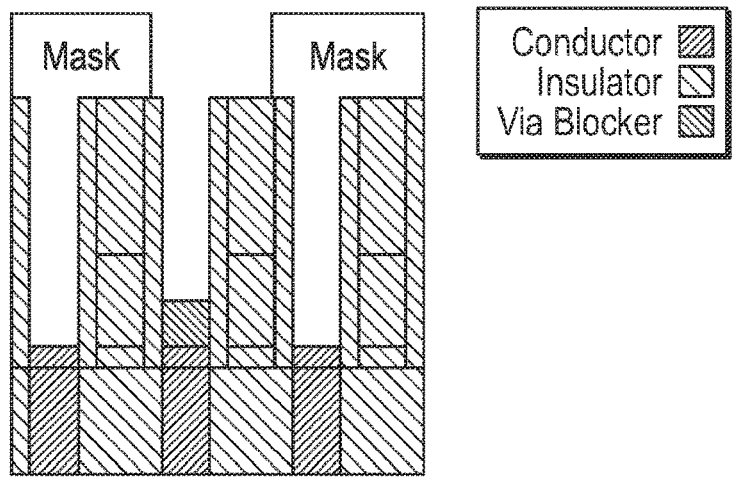
Figure 2C:
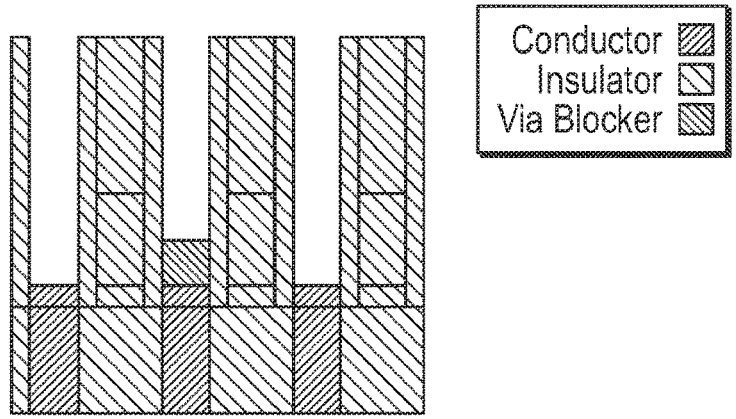
Figure 2D:
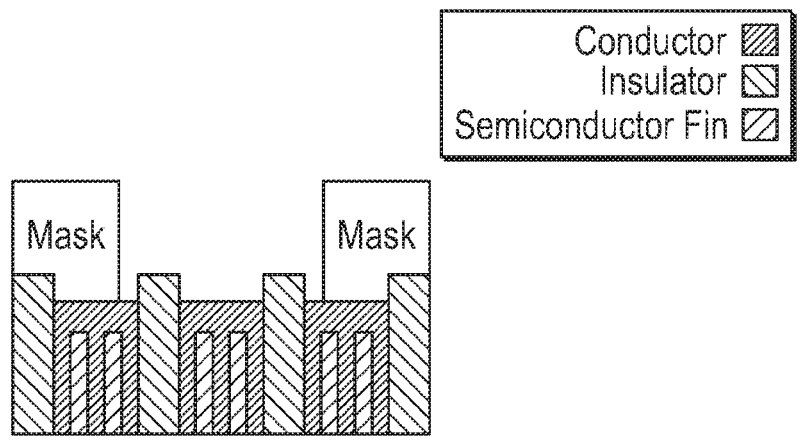
FIGS. 2d-f illustrate alternate cross-sectional views of the example processes shown in FIGS. 2a-c.
Figure 2E:
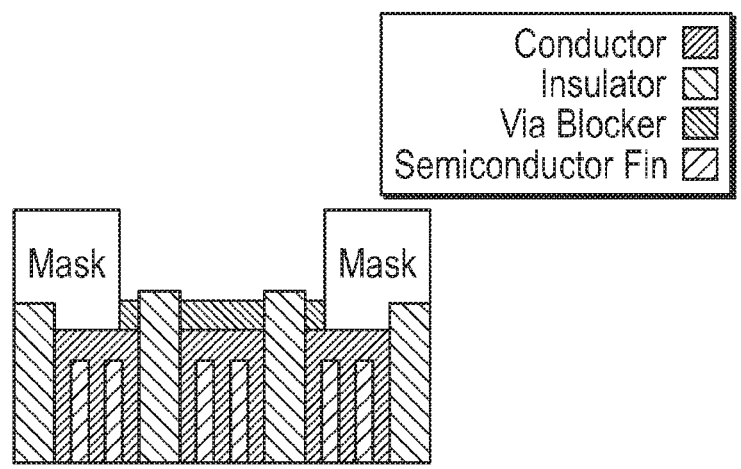
Figure 2F:
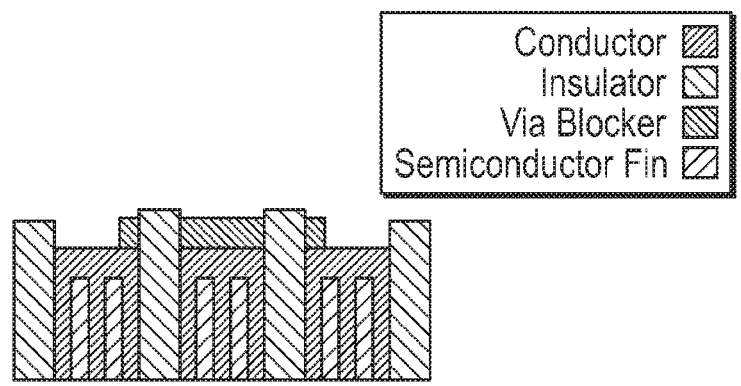

FIGS. 2a-f illustrate various process details for forming a via blocking layer using selective deposition and example resulting structures, in accordance with an embodiment of the present disclosure. As will be appreciated in light of this disclosure, the techniques provided herein can be used to fabricate integrated circuitry including any type of transistor topology, including planar topologies and non-planar topologies such as fin-based transistors, nanowire-based transistors, and nanoribbon-based transistors. In this example embodiment, assume a fin-based topology, wherein FIGS. 2a-c show cross-section side views of the fin region, and FIGS. 2d-f show alternate cross-section side views of the source/drain region (view rotated 90 degrees from the view of FIGS. 2a-c). In general, the downward-going (left to right) diagonal cross-hatched portions are dielectric materials (e.g., such as silicon dioxide, silicon nitride, high-k dielectrics, and low-k dielectrics) and etch stops (e.g., silicon nitride), and the plain or unshaded portions are conductive materials (e.g., metals such as silver, gold, tungsten, titanium, and alloys thereof), unless otherwise indicated. As can be further seen, the upward-going (left to right) diagonal cross-hatched portions are semiconductor fins (best shown in FIGS. 2d-f) which can be, for example, silicon, germanium, SiGe, III-V materials, or some other suitable substrate/fin material, and the horizontal cross-hatching represents the via blocker layers (e.g., insulator material such as silicon dioxide, hafnium oxide, hafnium silicon oxide, or other suitable dielectric material). As will be further appreciated in light of this disclosure, the specific details of the example structures shown are not intended to be limiting in any way and are only provided to show different contexts in which a blocking layer can be provided. Indeed, a via blocking layer as provided herein can be used in any interconnect structure, and the surrounding integrated circuit structure itself is not particularly relevant. Hence, description of that surround structure is limited.

As can be seen in FIGS. 2a and 2d, the example process flow includes patterning the via blocking area using a mask material (e.g., photoresist, carbon hard mask, or some other suitable making material). FIGS. 2b and 2e show selective deposition of insulator material (via blocker) on the metal in the exposed via area, which can be achieved using a selective passivation layer as will be discussed in more detail with reference to FIG. 4. This approach will block ALD deposition on the trench sidewalls but maintain deposition of a smooth insulating high-k film on the metal, in accordance with some such embodiments. FIGS. 2c and 2f show the structure after the mask has been removed, which can be carried out, for instance, by a dry ash other suitable etch process. The process may continue with a metal fill process that effectively creates a lateral conductive interconnect running across the top of the structure thereby connecting the first and third vias shown, wherein the via blocking layer causes the middle via to be skipped over. Other features, such as barrier layers and liners, may also be provided in the trench.

Note in this embodiment, the via blocker layer is planar. In other embodiments, the via blocking layer may be non-planar. In one such case, the via blocking layer be configured as shown, but also be deposited over the two middle intervening ILD columns, shown in FIGS. 2e and 2f. As previously explained, the via blocking layer can be implemented in any form needed to electrically isolate one or more vias from other vias in that same layer of the interconnect structure.

Figure 3A:
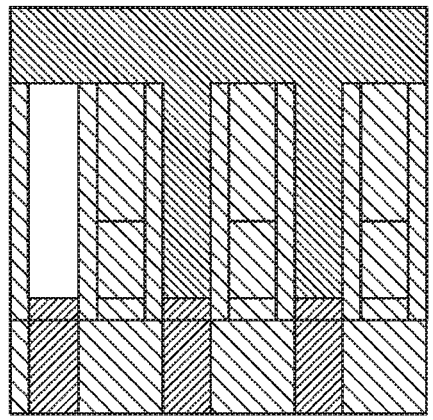
FIGS. 3a-d illustrate various process details for forming a via blocking layer using spin-coating, in accordance with another embodiment of the present disclosure.
Figure 3B:
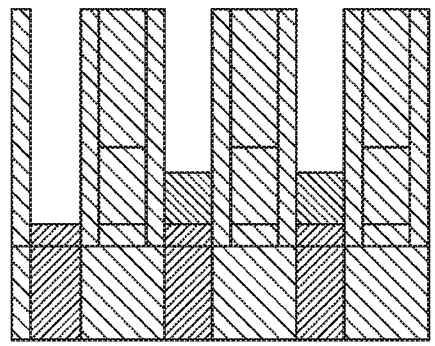

FIGS. 3a-d illustrate various process details for forming a via blocking layer using spin-coating, in accordance with another embodiment of the present disclosure. The previous relevant discussion with respect to FIGS. 2a-f regarding the structure and materials and nature of the via blocking layer is equally applicable here, as will be appreciated. FIGS. 3a and 3e show the resulting example structure after a via blocker material (e.g., high-k polymeric material, or nanoparticle laden formulation, or other suitable spin-on insulator coatings) is spin-coated onto the structure. FIGS. 3b and 3f show the example resulting structure after a wet recess is carried out to remove excess via blocker material. Note in this example case, the via blocker layer passes over intervening dielectric materials in addition to the metal vias being electrically isolated (FIG. 3f).

Figure 3C:
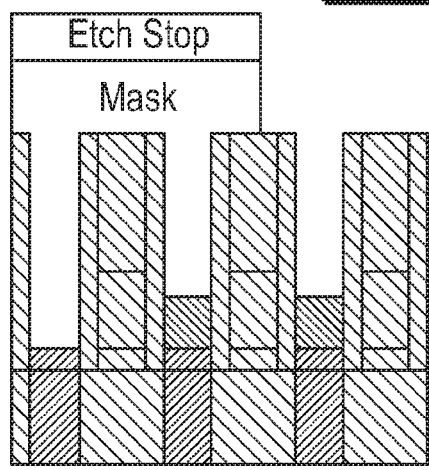
Figure 3D:
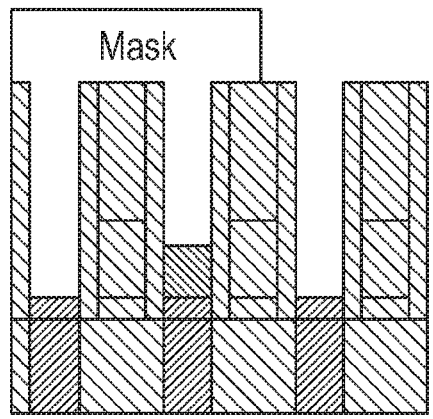
Figure 3E:
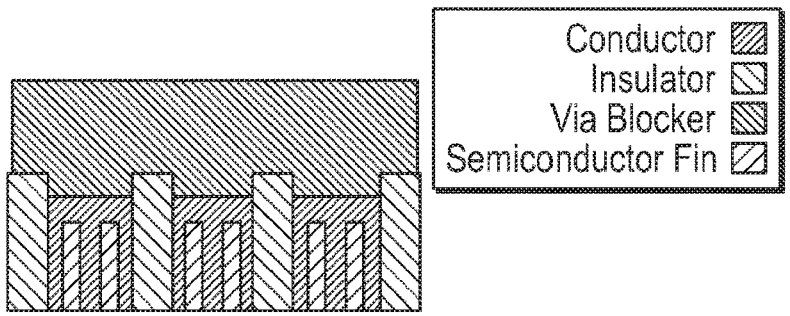
FIGS. 3e-h illustrate alternate cross-sectional views of the example processes shown in FIGS. 3a-d.
Figure 3F:
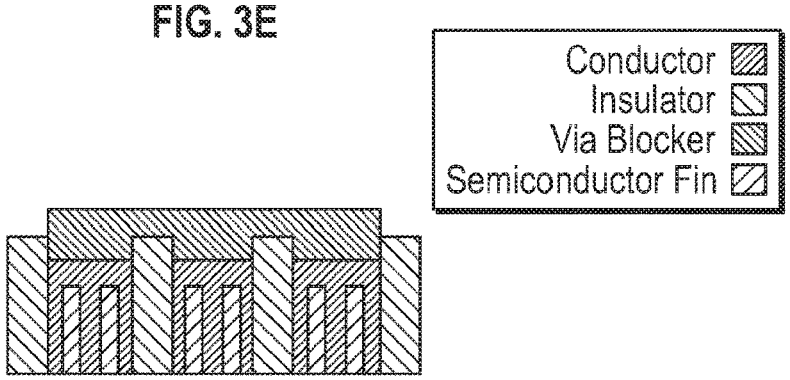
Figure 3G:
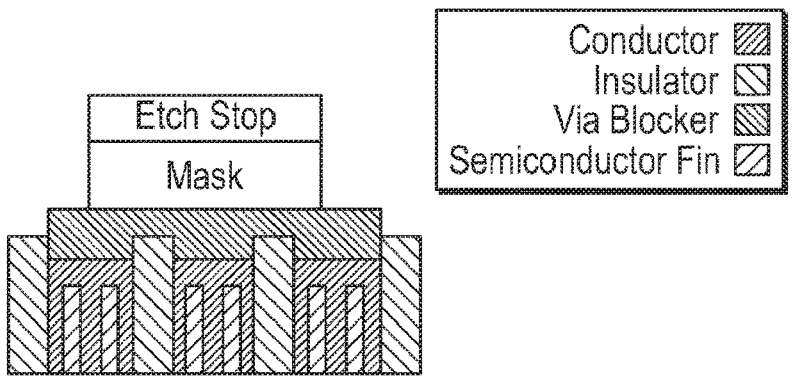
Figure 3H:
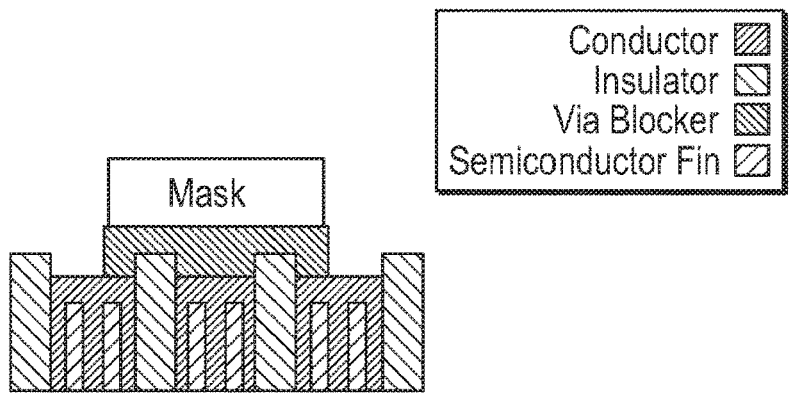

FIGS. 3c and 3g show the example resulting structure after patterning the mask for the local interconnect (or other feature of the semiconductor), and FIGS. 3d and 3h down the resulting structure after the wet strip process to remove the excess via blocker material, in accordance with an embodiment. In this example case, note the mask includes an etch stop layer to further assist in the forming process. In particular, the strip rate of the etch stop materials is slower than the strip rate of the via blocking material, with respect to the wet strip chemistry. Further details of example spin-on forming processes for making via blocking layers will be provided in turn with respect to FIG. 5.

Figure 4:
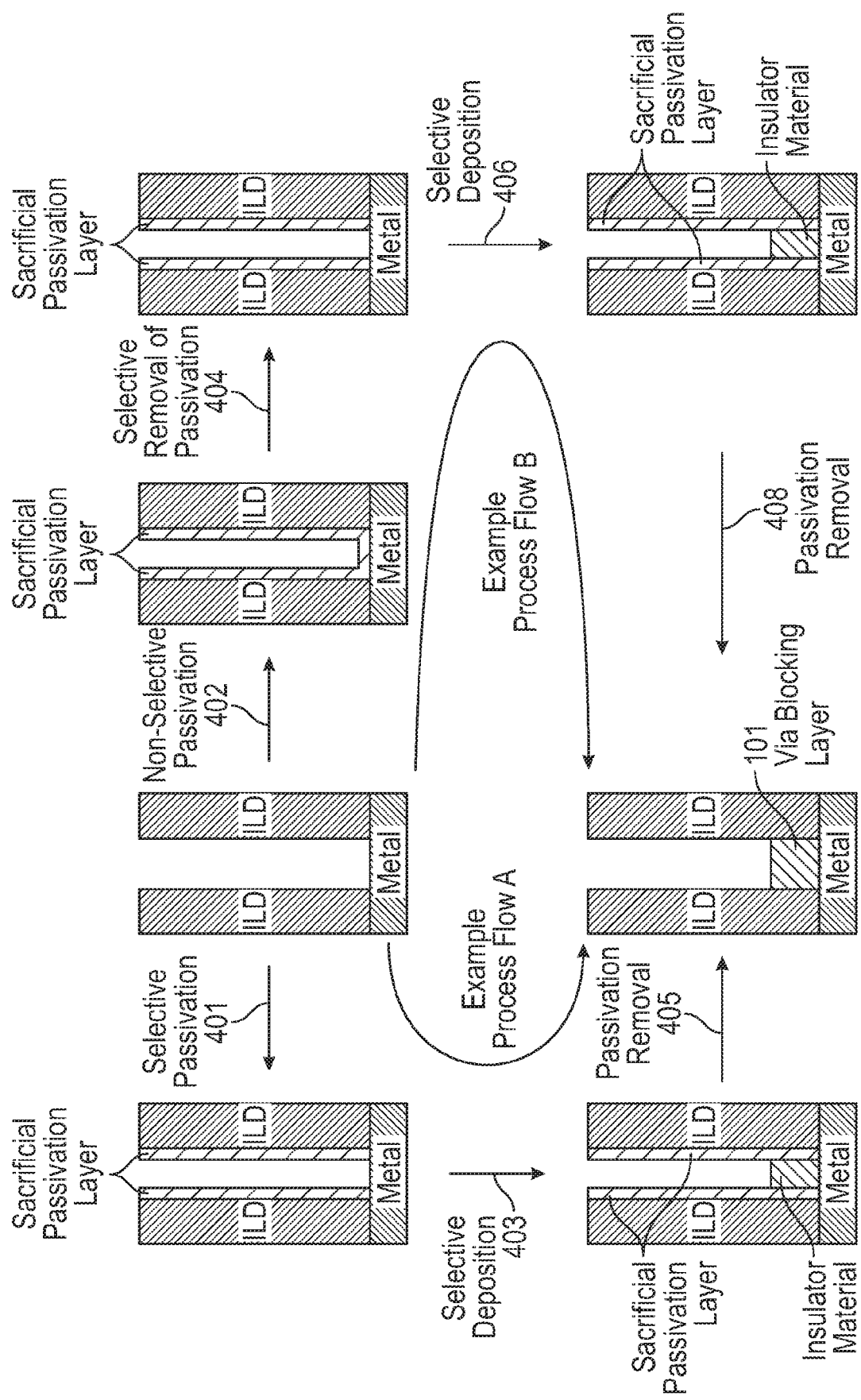
FIG. 4 illustrates further process details for forming a via blocking layer using selective deposition, in accordance with various embodiments of the present disclosure.

FIG. 4 illustrates further process details for forming a via blocking layer using selective deposition, in accordance with various embodiments of the present disclosure. As can be seen, two example process flows are provided (A and B). In general, each process flow involves the use of a sacrificial passivation layer that prevents or otherwise inhibits the subsequently deposited insulator material used for the via blocking layer from adhering to the trench sidewalls. In this way, the sacrificial passivation layer allows for the selective deposition of the via blocking insulator material. As will be appreciated, FIG. 4 has been simplified to only show a trench formed in an ILD layer, with metal to be covered by the via blocking layer underlying the trench. Numerous other configurations will be apparent. For instance, the trench may have a lower via portion and a wider upper line portion. Also, while the metal is shown below the trench, in other embodiments the metal may actually be within the trench. Further note that the trench configuration may vary. For instance, in another embodiment the trench is a dual damascene trench having a lower via portion containing the lower metal and an upper trench portion containing the fill metal (e.g., metal line or other conductive feature). In such embodiments, note that the lower metal may be inside the lower portion of the dual damascene trench or below the lower portion of that trench. Also, the trench may further include one or more barrier layers or liners. The techniques provided herein can be used with any such configurations.

PROCESS FLOW A: Process flow A includes selective passivation at 401, wherein a sacrificial passivation layer is provided only on the trench sidewalls and not on the trench bottom. Thus, the metal at the bottom of the trench is left uncovered by the sacrificial passivation layer. The process flow continues at 403, which includes a selective deposition of insulator material which will form the via blocking layer 101. In some example embodiments, the selectively deposited insulator material can be, for example, any suitable oxide such as $SiO_2$ or high-k gate dielectric materials. The process flow A continues at 405, with passivation removal.

PROCESS FLOW B: Process flow B includes non-selective passivation of the trench at 402, wherein a sacrificial passivation layer is provided on both the trench sidewalls and on the trench bottom. The process flow continues at 404, which includes a selective removal of the passivation layer from the trench bottom, which can be accomplished, for instance, by way of a directional (anisotropic) etch. The process flow continues at 406, which includes a selective deposition of insulator material which will form the via blocking layer 101. In some example embodiments, the selectively deposited insulator material can be, for example, any suitable oxide such as $SiO_2$ or high-k gate dielectric materials. The process flow A continues at 408, with passivation removal.

Examples of high-k dielectric materials that can be used for the insulator material deposited at 403 and 406 include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the via blocking layer 101 to improve its quality when a high-k material is used. In general, the thickness of the via blocking layer 101 should be sufficient to electrically isolate the targeted via from its adjacent metal interconnect feature.

As will be appreciated in light of this disclosure, selective deposition at 403 and 406 can be engineered by first depositing the sacrificial blocking layer at 401 or 402. In one embodiment, the sacrificial passivation layer is implemented with a self-assembled monolayer (SAM) on the trench surfaces where no high-k or other insulator film (via blocker) is desired. SAMs that attach preferentially to dielectric surfaces (such as the trench sidewalls) can be made, for example, from silane chemistries such as chloro-, alkoxy-, and amino silanes with long alkane (octadecyl trichlorosilane, trimethoxy(octadecyl)silane, etc) or fluorocarbon (triethoxy(3,3,4,4,5,5,6,6,7,7,8,8,9,9,10,10,10-heptadecafluorodecyl, 1-(3,3,4,4,5,5,6,6,7,7,8,8,9,9,10,10,10-heptadecafluorodecyl)-N,N,N',N',N'',N''-hexamethylsilanetriamine, etc) silane, chains. As will be appreciated, carbon chain length can vary from 10-20 carbons, in accordance with an embodiment. Other suitable sacrificial passivation materials that allow for the selective deposition of the via blocking material in the trench bottom will be apparent in light of this disclosure.

In one specific example embodiment, the passivant molecules form a blanket monolayer that blocks all but the metal surface to be blocked/isolated. Other thicknesses may be used as well, depending on the material used for the passivation layer. If the selectivity of the passivation layer is insufficient due to, for example, the possible reactivity of the passivant on both the metal and dielectric surfaces, then at least one of thermal annealing (e.g., 450° C. for 30 minutes) and wet etch (e.g., 50:1 $HF:H_2O$ for 1 minute) can be used to completely remove any passivant that reacted on the metal surface while maintaining passivation on the dielectric part (trench sidewalls).

After the insulator material for the via blocking layer 101 is deposited, removal of the passivation layer at 405 and 408 can be carried out, for example, by at least one of thermal treatments at temperatures higher than 450° C. and by other wet etch conditions. For instance, in one example embodiment, the sacrificial passivation layer is implemented with self-assembled monolayers and can be removed by any wet method, such as with an oxidizing or reducing agent to break the covalent bond between substrate and monolayer, by etching away a very thin layer of the substrate thereby releasing the molecules. The resulting via blocking layer 101 can have a thickness in the range of, for example, 0.5-10 nm, or 1-5 nm, or 2-3 nm, in accordance with a few example embodiments.

There are a number of low temperature ALD processes suitable for depositing high-k materials such as $HfO_2$ or $ZrO_2$ compatible with a SAM-based passivation layer blocking. For example, tetrakis(dimethylamido)hafnium will react with water at 250° C. in an ALD process to produce $HfO_2$ films with good electrical/leakage properties, as further indicated by Equation 1 below.

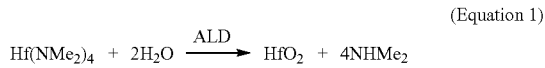

(Equation 1)

Once the via blocking layer 101 is provided, a subsequent metal fill deposition process can be performed to fill in the interconnect layer, wherein the via blocking layer 101 allows that trench to be electrically isolated and skipped over as previously explained. Other processes for that layer will be apparent in light of this disclosure, such as CMP-based planarization and deposition of an etch stop layer.

Figure 5:
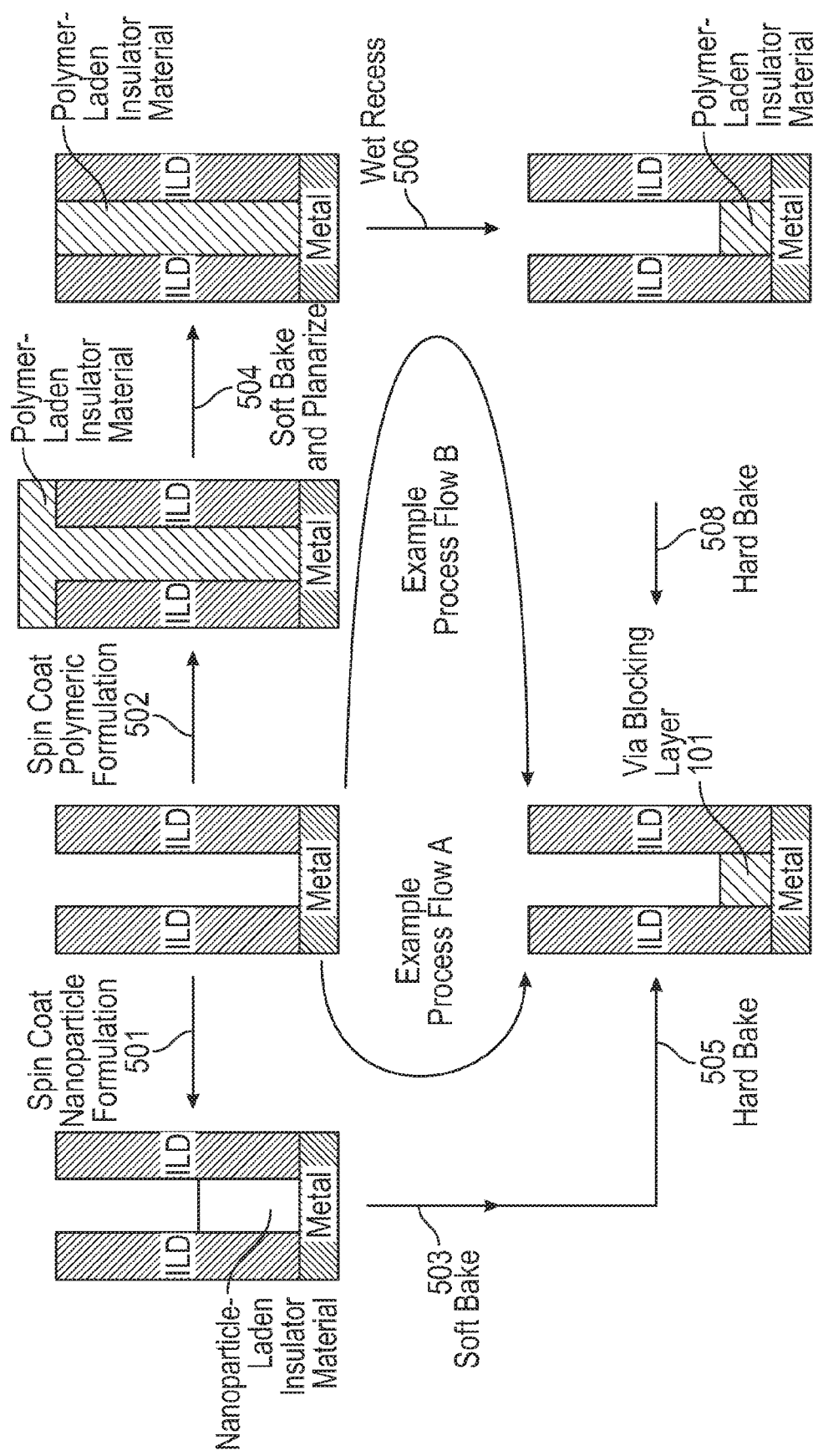
FIG. 5 illustrates further process details for forming a via blocking layer using spin-coating, in accordance with various embodiments of the present disclosure.

FIG. 5 illustrates further process details for forming a via blocking layer using spin-coating, in accordance with various embodiments of the present disclosure. As can be seen, two example process flows are provided (A and B). In general, each process flow involves the use of a spin-coating process for depositing insulator material used for the via blocking layer. As will be appreciated, FIG. 5 has been simplified to only show a trench formed in an ILD layer, with metal to be covered by the via blocking layer underlying the trench. Numerous other configurations will be apparent. For instance, the trench may have a lower via portion and a wider upper line portion. Also, while the metal is shown below the trench, in other embodiments the metal may actually be within the trench. Also, the trench may further include one or more barrier layers or liners. The techniques provided herein can be used with any such configurations.

Figure 6A:
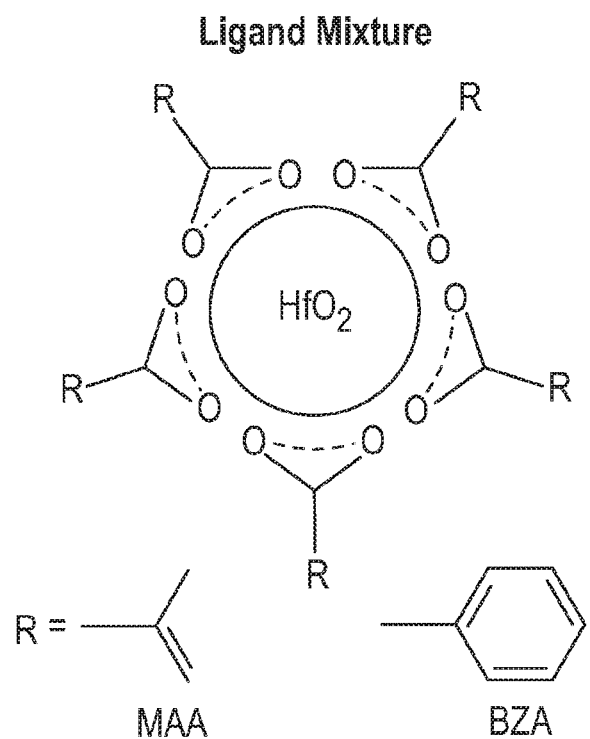
FIG. 6a illustrates the chemical structure of nanoparticles that can be used in a spin-coating based process for forming a via blocking layer, in accordance with an embodiment of the present disclosure.

PROCESS FLOW A: Process flow A includes spin-coating of a nanoparticle formulation at 501, thereby providing a deposition of nanoparticle-laden insulator material which will form the via blocking layer 101. In some example embodiments, the spin-on nanoparticles formulation comprises, for instance, HfOx, ZrOx, TiOx, WOx, TaOx, and CeOx, to name a few examples. In one specific example case, hafnium oxide nanoparticles are coated in a mixture of methacrylate and benzoate ligands to promote solubility in common organic spinning solvents. FIG. 6a illustrates the chemical structure of such Hf-BZA nanoparticles. As will be appreciated, the particle size can vary from one embodiment to the next (e.g., 1-10 nm), but in one example case the diameter of the nanoparticles is in the range of 1-2 nm so as to enable good gapfill of narrow trenches. In one specific example such process flow, a dilute nanoparticle solution in propylene glycol monomethyl ether acetate or so-called PGMEA (e.g., 1.6 wt % particles in PGMEA) is dispensed onto a wafer and puddled for ~5 sec, then spun off, so as to allow the nanoparticles to settle into the bottom of the trench. The example process flow A further continues with a low temperature soft bake at 503 to drive off excess solvent (e.g., 110° C. for 60 seconds) of the nanoparticle solution, followed by a high temperature hard bake at 505 to remove the organic ligands and thermally cross-link the hafnium oxide core (e.g., 400-450° C., for 1-2 hours) to form the via blocking layer 101.

PROCESS FLOW B: Process flow B includes spin-coating of a wet-recessible polymeric formulation at 502, thereby providing a deposition of polymer-laden insulator material which will form the via blocking layer 101. In some example embodiments, the spin-on polymeric formulation comprises, for instance, HfOx, ZrOx, TiOx, WOx, TaOx, and CeOx. As can be further seen, the polymer-laden insulator material deposited into the existing trenches by way of spin-coating may form an overburden. The process flow continues with a soft bake at 504 to remove excess solvent (e.g., 80-250° C., for 1-30 minutes), and may further include planarization to provide a desired degree of thickness uniformity. The process flow continues with a wet recess at 506 to recess the polymer-laden insulator material to a desired thickness. In one example embodiment, for instance, a controlled dissolution of the material in an organic solvent (e.g., PGMEA, tetramethylammonium hydroxide or so-called TMAH, ethyl lactate, toluene, methyl ethyl ketone, butyl acetate, acetone, methoxybenzene, or other non-polar solvents) is used to recess the polymer-laden insulator material to a desired thickness. Finally, the wafer is subject to a high-temperature cure (e.g., 400-450° C., for 1-2 hours) to densify and cross-link the remaining material.

Figure 6B:
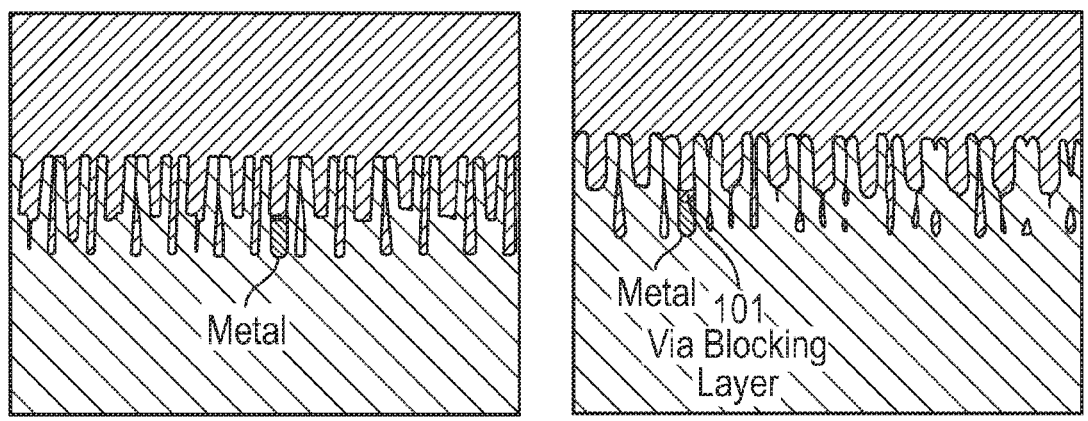
FIG. 6b illustrates scanning electron microscope (SEM) images of an actual interconnect structure configured with a via blocking layer made with nanoparticles, in accordance with an embodiment of the present disclosure.

The resulting via blocking layer 101 resulting from such spin-coating based process flows can have a thickness in the range of, for example, 2-15 nm, or 4-12 nm, or 5-10 nm, in accordance with a few example embodiments. FIG. 6b illustrates scanning electron microscope (SEM) images of an actual interconnect structure configured with a via blocking layer 101 made with spin-coated nanoparticles in accordance with the process flow A of FIG. 5, in accordance with an embodiment. This example blocking layer 101 is implemented with $HfO_2$ film with nanoparticles.

Just as explained with reference to FIG. 4, once the via blocking layer 101 shown in FIG. 5 is provided, a subsequent metal fill deposition process can be performed to fill in the interconnect layer, wherein the via blocking layer 101 allows that trench to be electrically isolated and skipped over as previously explained. Other processes for that layer will be apparent in light of this disclosure, such as deposition of barrier layers, CMP-based planarization, and deposition of an etch stop layer.

Figure 7:
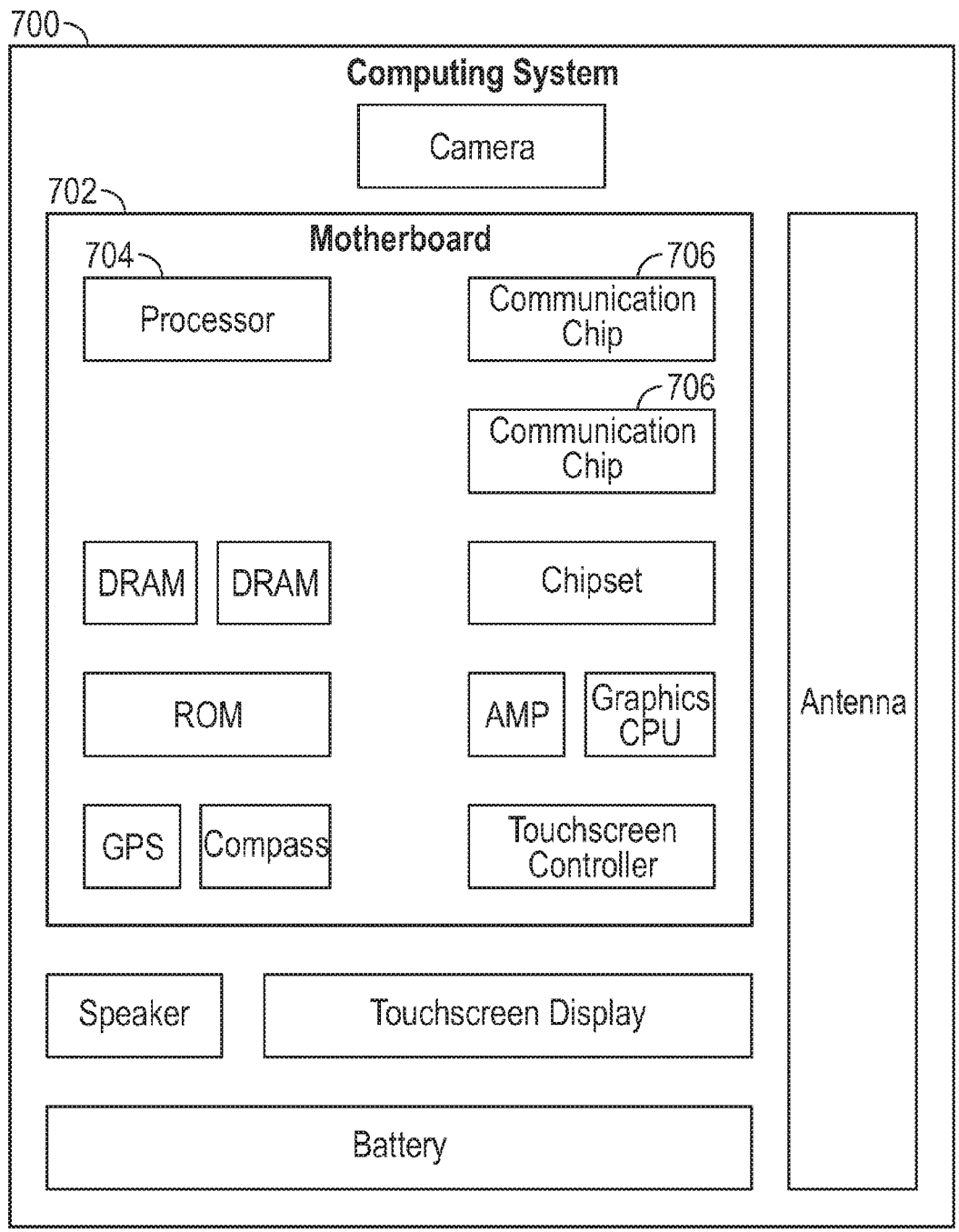
FIG. 7 illustrates a computing system implemented with one or more integrated circuits comprising interconnect structures configured in accordance with an embodiment of the present disclosure.

FIG. 7 illustrates a computing system 700 implemented with one or more integrated circuits comprising interconnect structures configured and/or otherwise fabricated in accordance with an example embodiment of the present disclosure. As can be seen, the computing system 700 houses a motherboard 702. The motherboard 702 may include a number of components, including but not limited to a processor 704 and at least one communication chip 706, each of which can be physically and electrically coupled to the motherboard 702, or otherwise integrated therein. As will be appreciated, the motherboard 702 may be, for example, any printed circuit board, whether a main board or a daughterboard mounted on a main board or the only board of system 700, etc. Depending on its applications, computing system 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 700 may include one or more integrated circuit structures configured with one or more conductive interconnect features as variously described herein, such as an interconnect having one or more isolated/skipped vias 105 by virtue of corresponding via blocking layers 101. These integrated circuit structures can be used, for instance, to implement an on-board processor cache or memory array or other circuit feature that includes interconnects. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing system 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing system 700 includes an integrated circuit die packaged within the processor 704. In some embodiments of the present disclosure, the integrated circuit die of the processor includes onboard memory circuitry that is implemented with one or more integrated circuit structures configured with one or more conductive interconnect features as variously described herein. The term "processor" may refer to any device or portion of a device that processes, for instance, electronic data from registers and/or memory to transform that electronic data into other electronic data that may be stored in registers and/or memory.

The communication chip 706 may also include an integrated circuit die packaged within the communication chip 706. In accordance with some such example embodiments, the integrated circuit die of the communication chip includes one or more devices implemented with one or more integrated circuit structures formed as variously described herein (e.g., interconnect having one or more via blocking layers). As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processors 704 and/or communication chips 706 can be used. Likewise, any one chip or chip set can have multiple functions integrated therein.

In various implementations, the computing system 700 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 700 may be any other electronic device that processes data or employs integrated circuit features configured with one or more conductive interconnect features, as variously described herein.

FIGS. 8(a)-(f) include an embodiment of an iVCT process 800. The embodiment is a flow in addition to the flows already described above with regard to, for example, FIGS. 4 and 5. This embodiment includes a flow whereby trench 801 is formed within dielectric 802 and on metal fill 803 from an underlying metal layer (FIG. 8(a)). Process 800 then includes depositing a thin conformal ALD metal oxide (e.g., HfO2, ZrOx, TiOx, WOx, TaOx, and/or CeOx) 804 over the entire surface of trench 801 (FIG. 8(b)). A recessable carbon hard mask (CHM) 805 (or other mask in other embodiments) is then deposited (FIG. 8(c)) and recessed to a minimal height at the bottom of the trench (FIG. 8(d)). A selective etch process for the conformal oxide is then applied to remove the exposed oxide from the sidewalls of the trench except from beneath the CHM (FIG. 8(e)). The CHM can then be removed, and the un-etched metal oxide film will remain as an insulating layer (FIG. 8(f)).

Figure 9:
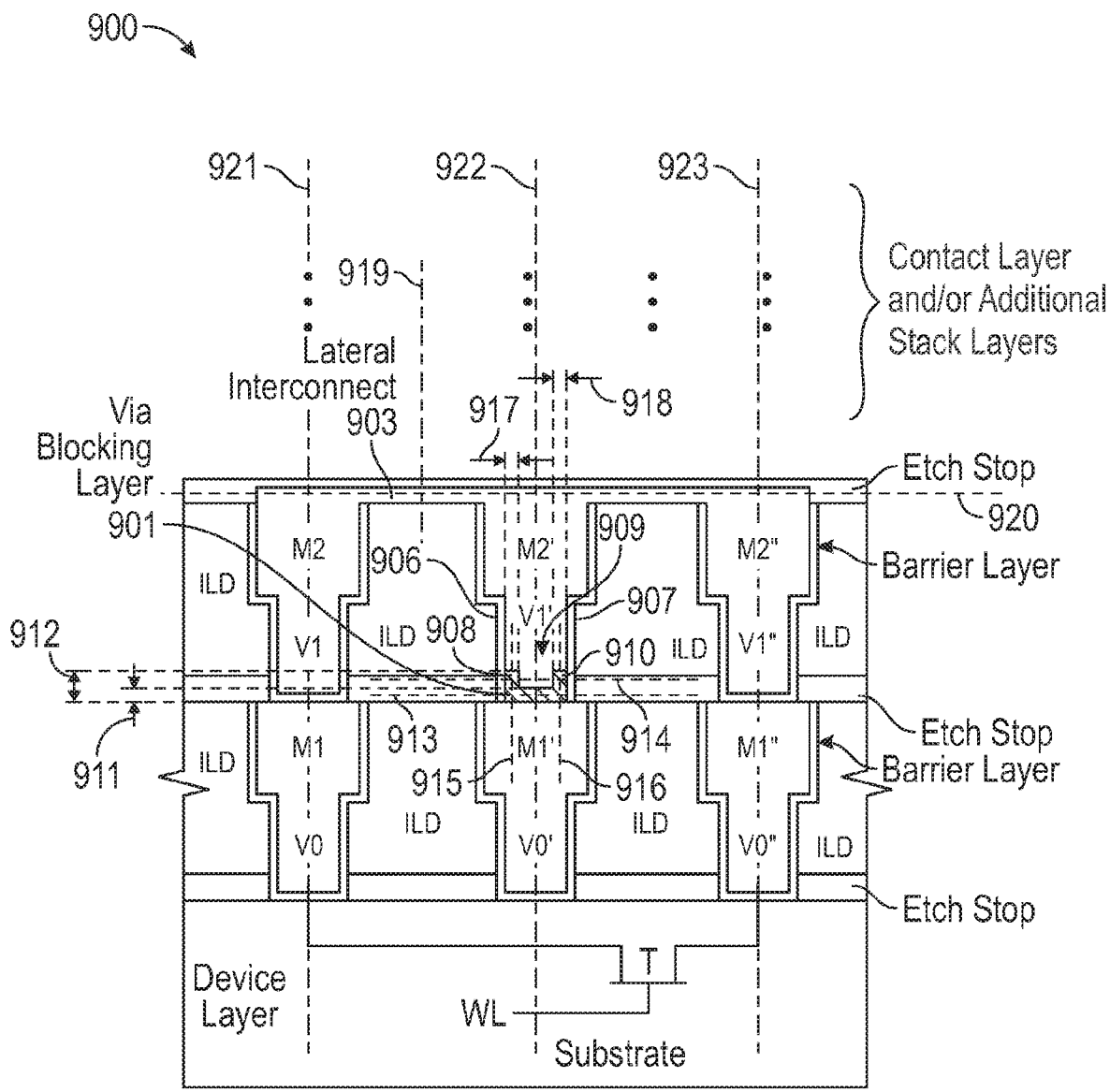
FIG. 9 includes an embodiment of an iVCT.

FIG. 9 includes embodiment of an iVCT. Apparatus 900 includes a metal layer (M1 layer) comprising metal interconnect lines M1, M1', M1" respectively on vias V0, V0', V0". An additional metal layer (M2 layer) comprises metal interconnect lines M2, M2', M2" respectively on vias V1, V1', V1". Vias V1 and V1" respectively couple metal interconnect lines M2, M2" to interconnect lines M1, M1". A lateral metal interconnect 903, included entirely within the M2 layer, is coupled to each of the metal interconnect lines M2, M2', M2". Metal oxide 901 is included entirely between sidewalls 906, 907 of the V1' via and between the V1' via and metal interconnect line M1'. By being between the V1' via and metal interconnect line M1' the via V1' is open-circuited by the metal oxide 901.

Metal oxide 901 (via blocking layer) has a middle portion 909 between two lateral portions 908, 910. Middle portion 908 has a maximum height 911 and the two lateral portions each have a maximum height 912 that is greater than the maximum height 911.

A horizontal axis 913 intersects the via V1', the middle portion 909, and the two lateral portions 908, 910; and a horizontal axis 914, above the horizontal axis 913, intersects the V1' via and the two lateral portions 908, 910 but not the middle portion 909.

Vertical axes 915, 916 respectively intersect the lateral portions 908, 910, the V1' via, the M2' metal interconnect line, the M1' metal interconnect line, and the V0' via.

The two lateral portions 908, 910 respectively include first and second thicknesses 917, 918 taken along the horizontal axis 914 and the middle portion 909 includes a thickness 911, taken orthogonal to the horizontal axis 914, which is generally equal to the first and second thicknesses 917, 918. The equality of these thicknesses 917, 918, 911 illustrates the conformal deposition (e.g., ALD) of the metal oxide layer. In other words, the metal oxide is included in a layer conformal to a bottom of the V1' via and the two sidewalls 906, 907 of the V1' via.

In the embodiment of FIG. 9 the metal oxide 901 does not extend above the via V1' and into the metal interconnect line M2'. As a result, resistance and other electric properties may be maximized for lateral interconnect 903. However, circuit designs may change the heights 911 and/or 912 based on preferences for electrical properties (e.g., resistance, capacitance, resistive-capacitive (RC)) by adjusting the etch (FIG. 8(*d*)) to bring the mask down partially within trench M2', all the way through M2' and abutting V1', to just into V1', to within a lower half of V1'. In the embodiment of FIG. 9, the via V1' extends from a bottom of the metal interconnect line M2' to a top of the metal interconnect line M1'; and the metal oxide 901 does not extend into an upper half of the V1' via.

Regarding the lateral metal interconnect 903, the interconnect includes metal fill and the metal interconnect lines M2, M2', M2" respectively include metal fill that is monolithic with the metal fill of interconnect 903. These metals are not separate depositions in an embodiment and are formed efficiently as a single layer in the M2 metal layer. Further regarding the interconnect 903, horizontal axis 920 intersects the lateral metal interconnect 903 and vertical axes 921, 922, 923 respectively intersect the M2, M2', M2" interconnect lines and horizontal axis 920. This shows the ability to now route, within a single layer, along lines that are, for example, parallel or orthogonal to gates and the like without having to move around potential shorts (e.g., M2' and V1' if layer 901 were not present) horizontally and/or vertically (into upper or lower M layers).

Figure 8:
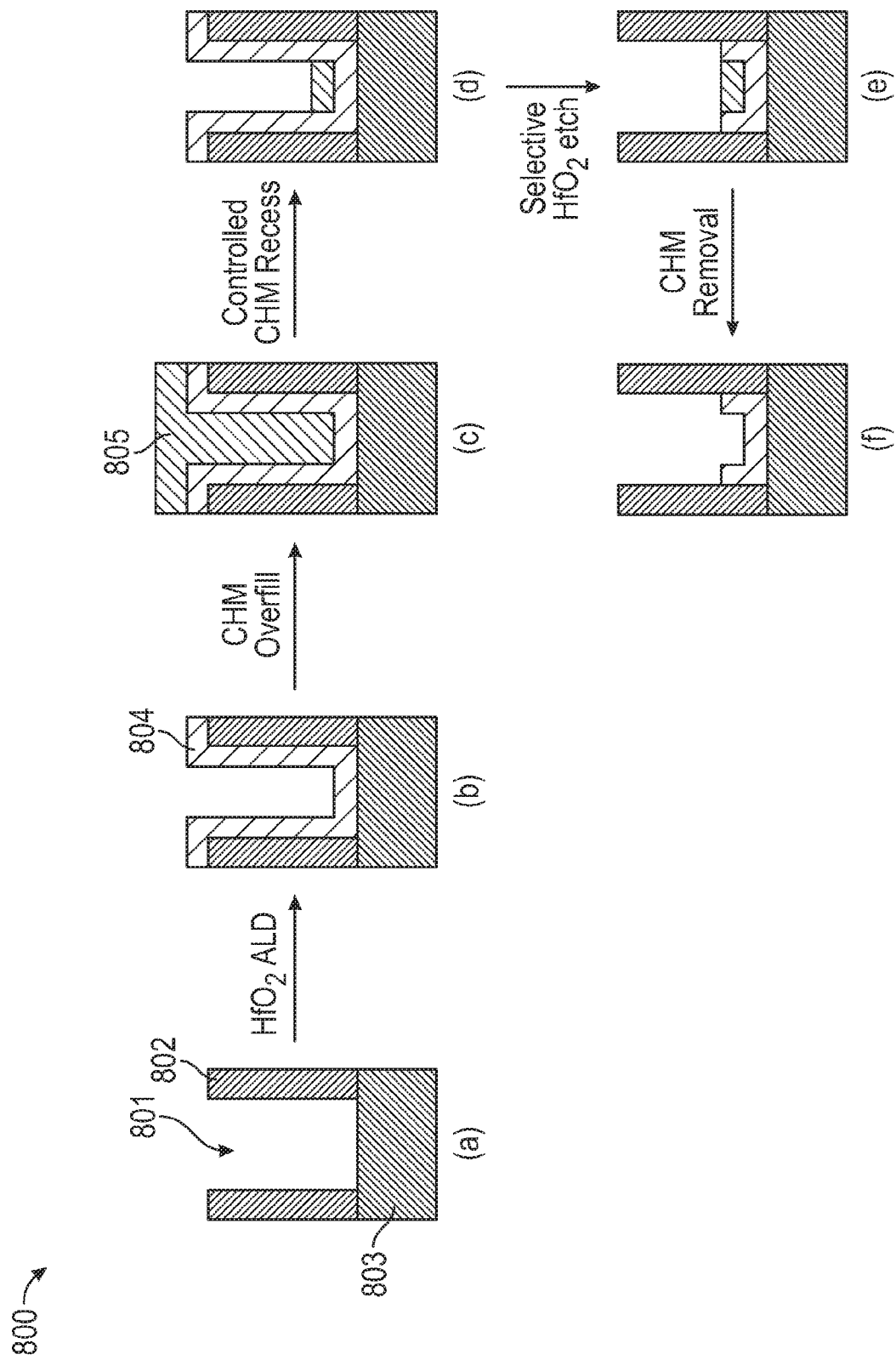
FIGS. 8(a)-(f) includes an embodiment of an iVCT process.

In an embodiment, a void may exist between the metal oxide 901 and one of the sidewalls 906, 907 of the via V1', wherein a horizontal axis (e.g., axis 914 or 913) intersects the via V1', the void, and the metal oxide 901. This void may occur if, for example, the process of FIG. 8 is used in conjunction with a passivation layer (e.g., FIG. 4). When such a passivation layer is removed (see stages 405, 408 of FIG. 4) a void may form. Such a void may be of a size that does not lend itself to a short (e.g., low current) of practical impact. The void is not limited to the embodiment of FIG. 9 and/or FIG. 8 and may be present in embodiments resulting from, for example, Flows A or B of FIG. 4.

Figure 10:
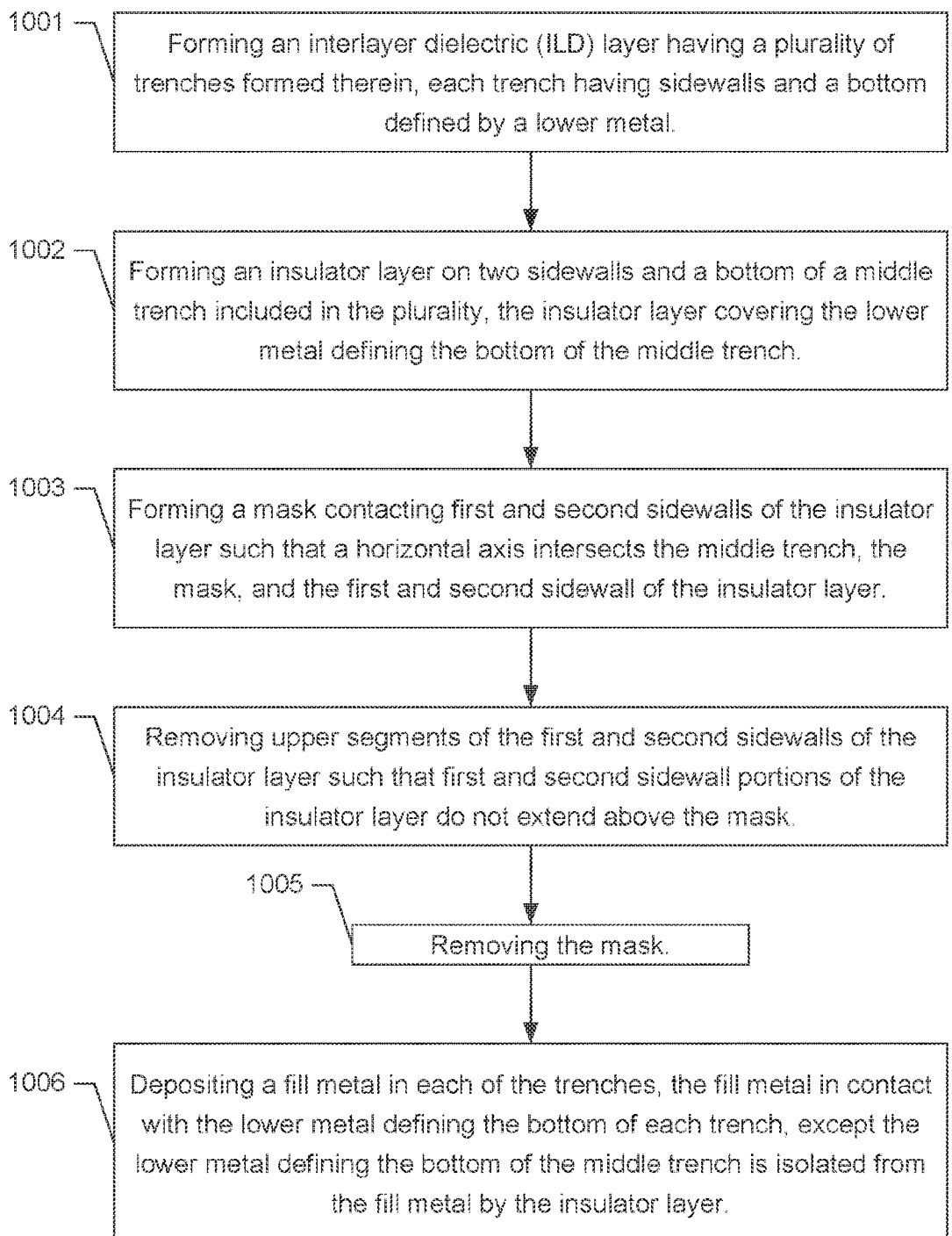
FIG. 10 includes an embodiment of an iVCT process.

FIG. 10 includes a process 1000 in an embodiment. Process 1000 includes block 1001, which provides forming an ILD layer having a plurality of trenches formed therein, each trench having sidewalls and a bottom defined by a lower metal. Block 1002 includes forming an insulator layer on two sidewalls and a bottom of a middle trench included in the plurality, the insulator layer covering the lower metal defining the bottom of the middle trench. Block 1003 includes forming a mask contacting first and second sidewalls of the insulator layer such that a horizontal axis intersects the middle trench, the mask, and the first and second sidewall of the insulator layer. Block 1004 includes removing upper segments of the first and second sidewalls of the insulator layer such that first and second sidewall portions of the insulator layer do not extend above the mask. Block 1005 includes removing the mask. Block 1006 includes depositing a fill metal in each of the trenches, the fill metal in contact with the lower metal defining the bottom of each trench, except the lower metal defining the bottom of the middle trench is isolated from the fill metal by the insulator layer.

The following examples pertain to further embodiments, from which numerous permutations and configurations will be apparent.

Example 1 is an integrated circuit device. The device includes an interlayer dielectric (ILD) layer having a plurality of trenches formed therein, each trench having sidewalls and a bottom defined by a lower metal. The device further includes an insulator layer on the bottom of a middle trench included in the plurality, the insulator layer covering the lower metal defining the bottom of the middle trench. The device further includes a fill metal in each of the trenches, the fill metal in electrical contact with the lower metal defining the bottom of each trench, except that the lower metal defining the bottom of the middle trench is isolated from the fill metal by the insulator layer.

Example 2 includes the subject matter of Example 1, wherein the plurality of trenches includes three trenches, including a left trench, the middle trench, and a right trench, the device further comprising a lateral interconnect that electrically connects the fill metal of the left, middle, and right trenches.

Example 3 includes the subject matter of Example 1 or 2, wherein the insulator layer comprises a high-k dielectric.

Example 4 includes the subject matter of Example 3, wherein the insulator layer comprises at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 5 includes the subject matter of any of the previous Examples, and further includes at least one of: another ILD layer over the fill metal; a passivation layer over the fill metal; an electronic device layer below the ILD layer; an electronic device layer over the fill metal; and a contact layer over the fill metal.

Example 6 includes the subject matter of any of the previous Examples, wherein the insulator layer has a thickness in the range of 0.5 nm to 10 nm.

Example 7 includes the subject matter of any of the previous Examples, wherein the thickness of the insulator layer is uniform, such that the thinnest part of the insulator layer is within 10% of the thickest part of that layer, or within 5% of the thickest part of that layer, or within 2% of the thickest part of that layer.

Example 8 includes the subject matter of any of the previous Examples, and further includes a barrier layer between the trench sidewalls and the fill metal. Other trench layers may also be provided, such as liners, adhesion layers, and seed layers.

Example 9 includes the subject matter of any of the previous Examples, wherein the trench is a dual damascene trench having a lower via portion containing the lower metal and an upper trench portion containing the fill metal. Note that the lower metal may be in the trench or below the trench.

Example 10 is a mobile computing system comprising the device of any of the previous Examples.

Example 11 includes the subject matter of Example 10, wherein the system is a smartphone or tablet computer. Other mobile computing devices will be apparent, such as wearable computing systems (e.g., glasses, bracelets, watches, fabrics). In still other embodiments, the computing system need not be mobile and may be, for instance, a work station or set-top box or desktop computer or game console. In a more general sense, the interconnect structures provided herein can be used in any electronic device of any kind.

Example 12 is a memory comprising the device of any of Examples 1-9. The memory may be volatile or non-volatile memory (e.g., RAM, DRAM, SRAM, Flash, ROM, PROM, EPROM, to name a few examples), and may be a standalone memory device or an integrated memory device (such as on-board cache or embedded memory).

Example 13 is a processor comprising the device of any of Examples 1-9. The processor may be, for example, a central processing unit, graphics processor, co-processor, video processor, or microcontroller. Any such processing environments can employ the various interconnect structures provided herein.

Example 14 is communication chip comprising the device of any of Examples 1-9. The communication chip may be, for example, a Wi-Fi chip or chip set or a network interface chip for wired or wireless communication links. Any such wired or wireless communication devices can employ the various interconnect structures provided herein.

Example 15 is a method for forming an interconnect structure. The method includes forming an interlayer dielectric (ILD) layer having a plurality of trenches formed therein, each trench having sidewalls and a bottom defined by a lower metal. The method further includes forming an insulator layer on the bottom of a middle trench included in the plurality, the insulator layer covering the lower metal defining the bottom of the middle trench. The method further includes depositing a fill metal in each of the trenches, the fill metal in electrical contact with the lower metal defining the bottom of each trench, except the lower metal defining the bottom of the middle trench is isolated from the fill metal by the insulator layer.

Example 16 includes the subject matter of Example 15, wherein forming the insulator layer comprises: depositing a sacrificial passivation layer that inhibits subsequently deposited insulator material from adhering to the trench sidewalls; and depositing the insulator material into the trench to cover the lower metal defining the bottom of the middle trench.

Example 17 includes the subject matter of Example 16, wherein depositing the insulator material comprises atomic layer deposition.

Example 18 includes the subject matter of Example 16 or 17, wherein the sacrificial passivation layer is deposited substantially on the trench sidewalls and not on the lower metal defining the bottom of the middle trench thereby leaving the lower metal substantially uncovered by the sacrificial passivation layer.

Example 19 includes the subject matter of Example 16 or 17, wherein the sacrificial passivation layer is deposited on both the trench sidewalls and on the lower metal defining the bottom of the middle trench. In one such case, the process further includes: selective removal of the passivation layer from the lower metal defining the bottom of the middle trench.

Example 20 includes the subject matter of any of Examples 16-19, wherein depositing the sacrificial passivation layer further comprises performing at least one of a thermal anneal and wet etch to remove any passivant that reacted on the lower metal.

Example 21 includes the subject matter of any of Examples 16-20, wherein the sacrificial passivation layer is implemented with a self-assembled monolayer (SAM).

Example 22 includes the subject matter of any of Examples 16-21, and further includes removing the sacrificial passivation layer.

Example 23 includes the subject matter of Example 22, wherein removing the sacrificial passivation layer includes at least one of thermal treatments and wet etch.

Example 24 includes the subject matter of Example 15, wherein forming the insulator layer comprises spin-coating a nanoparticle formulation.

Example 25 includes the subject matter of Example 24, wherein the nanoparticle formulation comprises hafnium oxide nanoparticles coated in a mixture of methacrylate and benzoate ligands.

Example 26 includes the subject matter of Example 24 or 25, wherein the nanoparticle formulation comprises nanoparticles having a diameter in the range of 1-2 nm.

Example 27 includes the subject matter of any of Examples 24-26, and further includes a soft bake to drive off excess solvent.

Example 28 includes the subject matter of Example 27, and further includes a hard bake to at least one of remove organic ligands and thermally cross-link the insulator layer.

Example 29 includes the subject matter of Example 15, wherein forming the insulator layer comprises spin-coating of a wet-recessible polymeric formulation.

Example 30 includes the subject matter of Example 29, and further includes a soft bake to drive off excess solvent.

Example 31 includes the subject matter of Example 30, and further includes planarization of the wet-recessible polymeric formulation.

Example 32 includes the subject matter of Example 30 or 31, and further includes a wet recess to recess the wet-recessible polymeric formulation to a desired thickness.

Example 33 includes the subject matter of any of Examples 30-32, and further includes a hard bake to at least one of densify and cross-link the insulator layer.

Example 34 includes the subject matter of any of Examples 15-33, wherein the plurality of trenches includes three trenches, including a left trench, the middle trench, and a right trench, the method further comprising forming a lateral interconnect that electrically connects the fill metal of the left, middle, and right trenches.

Example 35 is an integrated circuit device. The device includes an interlayer dielectric (ILD) layer having a plurality of trenches formed therein, each trench having sidewalls and a bottom defined by a lower metal, and wherein the plurality of trenches includes three trenches, including a left trench, the middle trench, and a right trench. The device further includes an insulator layer on the bottom of a middle trench included in the plurality, the insulator layer covering the lower metal defining the bottom of the middle trench, wherein the insulator layer comprises a high-k dielectric and has a thickness in the range of 0.5 nm to 10 nm. The device further includes a fill metal in each of the trenches, the fill metal in electrical contact with the lower metal defining the bottom of each trench, except that the lower metal defining the bottom of the middle trench is isolated from the fill metal by the insulator layer. The device further includes a lateral interconnect that electrically connects the fill metal of the left, middle, and right trenches.

Example 36 includes the subject matter of Example 35, and further includes at least one of: another ILD layer over the fill metal; a passivation layer over the fill metal; an electronic device layer below the ILD layer; an electronic device layer over the fill metal; and a contact layer over the fill metal.

Example 37 includes the subject matter of Example 35 or 36, wherein the insulator layer has a thickness in the range of 1 nm to 5 nm.

Example 38 includes the subject matter of any of Examples 35-37, wherein the thickness of the insulator layer is uniform, such that the thinnest part of the insulator layer is within 5% of the thickest part of that layer.

Example 39 includes the subject matter of any of Examples 35-38, and further includes a barrier layer between the trench sidewalls and the fill metal.

Example 40 includes the subject matter of any of Examples 35-39, wherein the trench is a dual damascene trench having a lower via portion containing the lower metal and an upper trench portion containing the fill metal. Note that the lower metal may be in the trench or below the trench.

Example 41 is a mobile computing system comprising the device of any of Examples 35-40.

Example 42 includes the subject matter of Example 41, wherein the system is a smartphone or tablet computer. Other mobile computing devices will be apparent, such as wearable computing systems (e.g., glasses, bracelets, watches, fabrics). In still other embodiments, the computing system need not be mobile and may be, for instance, a work station or set-top box or desktop computer or game console. In a more general sense, the interconnect structures provided herein can be used in any electronic device of any kind.

Example 43 is a memory comprising the device of any of Examples 35-40. The memory may be volatile or non-volatile memory (e.g., RAM, DRAM, SRAM, Flash, ROM, PROM, EPROM, to name a few examples), and may be a standalone memory device or an integrated memory device (such as on-board cache or embedded memory).

Example 44 is a processor comprising the device of any of Examples 35-40. The processor may be, for example, a central processing unit, graphics processor, co-processor, video processor, or microcontroller. Any such processing environments can employ the various interconnect structures provided herein.

Example 45 is communication chip comprising the device of any of Examples 35-40. The communication chip may be, for example, a Wi-Fi chip or chip set or a network interface chip for wired or wireless communication links. Any such wired or wireless communication devices can employ the various interconnect structures provided herein.

Example 1a includes an apparatus comprising: a metal layer comprising a plurality of interconnect lines that are on a plurality of vias; an additional metal layer comprising first, second, and third interconnect lines that are on first, second, and third vias; the first and third vias coupling the first and third interconnect lines to two of the plurality of interconnect lines; a lateral interconnect, included entirely within the additional metal layer, directly connected to each of the first, second, and third interconnect lines; and an insulator layer included entirely between two sidewalls of the second via.

Another version of Example 1A includes an apparatus comprising: a metal layer comprising a plurality of interconnect lines that are on a plurality of vias; an additional metal layer comprising first, second, and third interconnect lines that are on first, second, and third vias; the first and third vias coupling the first and third interconnect lines to two of the plurality of interconnect lines; a lateral interconnect, included entirely within the additional metal layer, directly connected to each of the first, second, and third interconnect lines; and an insulator layer included between two sidewalls of the second via.

Another version of Example 1A includes an apparatus comprising: a metal layer comprising a plurality of interconnect lines that are on a plurality of vias; an additional metal layer comprising first, second, and third interconnect lines that are on first, second, and third vias; the first and third vias coupling the first and third interconnect lines to two of the plurality of interconnect lines; a lateral interconnect, included within the additional metal layer, directly connected to each of the first, second, and third interconnect lines; and an insulator layer included between two sidewalls of the second via.

Notably a "lateral interconnect, included within the additional metal layer" as used herein means the interconnect is lateral and not vertical in the sense the interconnect does not extend between two metal layers but is within a single metal layer. If the interconnect extends a bit into etch stop layer 920 this does not mean the lateral interconnect is no longer lateral or not included within a single metal layer. In an embodiment, such as the embodiment of FIG. 9, the lateral interconnect is between two trenches and is not included in a trench or a via. For example, axis 919 intersects the lateral interconnect between trenches M2 and M2' and is not included in a trench or a via.

Example 2a includes the apparatus of example 1a wherein the insulator layer includes a metal and at least one of an oxide and a nitride.

Example 3a includes the apparatus of example 2a, wherein: the insulator layer has a middle portion of the insulator layer between two lateral portions of the insulator layer; and the middle portion has a maximum height and the two lateral portions each have a maximum height that is greater than the maximum height of the middle portion.

Example 4a includes the apparatus of example 3a wherein the lateral interconnect includes metal fill and the first, second, and third interconnect lines respectively include first, second, and third metal fill that are all monolithic with the metal fill.

Example 5a includes an apparatus comprising: a metal layer comprising a plurality of metal interconnect lines respectively on a plurality of vias; an additional metal layer comprising first, second, and third metal interconnect lines respectively on first, second, and third vias; the first and third vias respectively coupling the first and third metal interconnect lines to two of the plurality of metal interconnect lines; a lateral metal interconnect, included entirely within the additional metal layer, coupled to each of the first, second, and third metal interconnect lines; and a metal oxide included entirely between two sidewalls of the second via and between the second via and one of the plurality of metal interconnect lines.

Another version of example 5a includes an apparatus comprising: a metal layer comprising a plurality of metal interconnect lines respectively on a plurality of vias; an additional metal layer comprising first, second, and third metal interconnect lines respectively on first, second, and third vias; the first and third vias respectively coupling the first and third metal interconnect lines to two of the plurality of metal interconnect lines; a lateral metal interconnect, included entirely within the additional metal layer, coupled to each of the first, second, and third metal interconnect lines; and a metal oxide included between two sidewalls of the second via and between the second via and one of the plurality of metal interconnect lines.

Another version of example 5a includes an apparatus comprising: a metal layer comprising a plurality of metal interconnect lines respectively on a plurality of vias; an additional metal layer comprising first, second, and third metal interconnect lines respectively on first, second, and third vias; the first and third vias respectively coupling the first and third metal interconnect lines to two of the plurality of metal interconnect lines; a lateral metal interconnect, included entirely within the additional metal layer, coupled to each of the first, second, and third metal interconnect lines; and an insulator included between two sidewalls of the second via and between the second via and one of the plurality of metal interconnect lines.

The insulator may include, for example, a metal oxide and/or a metal nitride.

Another version of example 5a includes an apparatus comprising: a metal layer comprising a plurality of metal interconnect lines respectively on a plurality of vias; an additional metal layer comprising first, second, and third metal interconnect lines respectively on first, second, and third vias; the first and third vias respectively coupling the first and third metal interconnect lines to two of the plurality of metal interconnect lines; a lateral metal interconnect, included within the additional metal layer, coupled to each of the first, second, and third metal interconnect lines; and a metal oxide included entirely between two sidewalls of the second via and between the second via and one of the plurality of metal interconnect lines.

Example 6a includes the apparatus of example 5a wherein: the metal oxide has a middle portion between two lateral portions; the middle portion has a maximum height and the two lateral portions each have a maximum height that is greater than the maximum height of the middle portion.

Example 7a includes the apparatus of example 6a wherein: a first horizontal axis intersects the second via, the middle portion, and the two lateral portions; and a second horizontal axis, above the first horizontal axis, intersects the second via and the two lateral portions but not the middle portion.

Example 8a includes the apparatus of example 7a wherein first and second vertical axes respectively intersect the two lateral portions, the second via, the second metal interconnect line, the one of the plurality of metal interconnect lines, and one of the plurality of vias.

Example 9a includes the apparatus of example 7a wherein the two lateral portions respectively include first and second thicknesses taken along the second horizontal axis and the middle portion includes a thickness, taken orthogonal to the second horizontal axis, which is generally equal to the first and second thicknesses.

Example 10a includes the apparatus of example 6a wherein the metal oxide does not extend above the second via and into the second metal interconnect line.

Example 11a includes the apparatus of example 6a wherein the metal oxide is included in a layer conformal to a bottom of the second via and the two sidewalls of the second via.

Example 12a includes the apparatus of example 6a wherein the second via is open-circuited by the metal oxide and a portion of the lateral metal interconnect is between the first and second metal interconnect lines, is not included in a trench, and is not included in a via.

Example 13a includes the apparatus of example 6a wherein: the lateral metal interconnect includes metal fill and the first, second, and third metal interconnect lines respectively include first, second, and third metal fill; the metal fill and the first, second, and third metal fills are all monolithic with each other.

Example 14a includes the apparatus of example 6a, wherein: the second via extends from a bottom of the second metal interconnect line to a top of the one of the plurality of metal interconnect lines; and the metal oxide does not extend into an upper half of the second via.

Example 15a includes the apparatus of example 6a wherein: a horizontal axis intersects the lateral metal interconnect; and first, second, and third vertical axes respectively intersect the first, second, and third metal interconnect lines and each also intersect the horizontal axis.

Example 16a includes the apparatus of example 6a comprising a void between the metal oxide and one of the two sidewalls of the second via, wherein a horizontal axis intersects the second via, the void, and the metal oxide.

Example 17a includes a processor comprising the apparatus of any of examples 1a through 16a.

Example 18a includes a method comprising: forming an interlayer dielectric (ILD) layer having a plurality of trenches formed therein, each trench having sidewalls and a bottom defined by a lower metal; forming an insulator layer on two sidewalls and a bottom of a middle trench included in the plurality, the insulator layer covering the lower metal defining the bottom of the middle trench; forming a mask contacting first and second sidewalls of the insulator layer such that a horizontal axis intersects the middle trench, the mask, and the first and second sidewall of the insulator layer; removing upper segments of the first and second sidewalls of the insulator layer such that first and second sidewall portions of the insulator layer do not extend above the mask; removing the mask; and depositing a fill metal in each of the trenches, the fill metal in contact with the lower metal defining the bottom of each trench, except the lower metal defining the bottom of the middle trench is isolated from the fill metal by the insulator layer.

Example 19a includes the method of example 18a comprising forming a lateral metal interconnect, included ILD layer, coupled to the metal fill in each of the trenches.

Example 20a includes the method of example 18a wherein: the insulator layer has a middle portion between the first and second sidewall portions of the insulator layer; the middle portion has a maximum height and first and second sidewall portions of the insulator layer each have a maximum height that is greater than the maximum height of the middle portion.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An apparatus comprising:
   a metal layer comprising a plurality of interconnect lines that are on a plurality of vias;
   an additional metal layer comprising first, second, and third interconnect lines that are on first, second, and third vias; the first and third vias coupling the first and third interconnect lines to two of the plurality of interconnect lines;
   a lateral interconnect, included within the additional metal layer, directly connected to each of the first, second, and third interconnect lines; and
   an insulator layer included between two sidewalls of the second via.

2. The apparatus of claim 1 wherein the insulator layer includes a metal and at least one of an oxide, a nitride, or combinations thereof.

3. The apparatus of claim 2, wherein:
   the insulator layer has a middle portion of the insulator layer between two lateral portions of the insulator layer; and
   the middle portion has a maximum height and the two lateral portions each have a maximum height that is greater than the maximum height of the middle portion.

4. The apparatus of claim 3 wherein the lateral interconnect includes metal fill and the first, second, and third interconnect lines respectively include first, second, and third metal fill that are all monolithic with the metal fill.

5. An apparatus comprising:
a metal layer comprising a plurality of metal interconnect lines respectively on a plurality of vias;
an additional metal layer comprising first, second, and third metal interconnect lines respectively on first, second, and third vias; the first and third vias respectively coupling the first and third metal interconnect lines to two of the plurality of metal interconnect lines;
a lateral metal interconnect, included within the additional metal layer, coupled to each of the first, second, and third metal interconnect lines; and
a metal oxide included between two sidewalls of the second via and between the second via and one of the plurality of metal interconnect lines.

6. The apparatus of claim 5 wherein:
the metal oxide has a middle portion between two lateral portions; and
the middle portion has a maximum height and the two lateral portions each have a maximum height that is greater than the maximum height of the middle portion.

7. The apparatus of claim 6 wherein:
a first horizontal axis intersects the second via, the middle portion, and the two lateral portions; and
a second horizontal axis, above the first horizontal axis, intersects the second via and the two lateral portions but not the middle portion.

8. The apparatus of claim 7 wherein first and second vertical axes respectively intersect the two lateral portions, the second via, the second metal interconnect line, the one of the plurality of metal interconnect lines, and one of the plurality of vias.

9. The apparatus of claim 7 wherein the two lateral portions respectively include first and second thicknesses taken along the second horizontal axis and the middle portion includes a thickness, taken orthogonal to the second horizontal axis, which is generally equal to the first and second thicknesses.

10. The apparatus of claim 6 wherein the metal oxide does not extend above the second via and into the second metal interconnect line.

11. The apparatus of claim 6 wherein the metal oxide is included in a layer conformal to a bottom of the second via and the two sidewalls of the second via.

12. The apparatus of claim 6 wherein the second via is open-circuited by the metal oxide and a portion of the lateral metal interconnect is between the first and second metal interconnect lines, is not included in a trench, and is not included in a via.

13. The apparatus of claim 6 wherein:
the lateral metal interconnect includes metal fill and the first, second, and third metal interconnect lines respectively include first, second, and third metal fill; and
the metal fill and the first, second, and third metal fills are all monolithic with each other.

14. The apparatus of claim 6, wherein:
the second via extends from a bottom of the second metal interconnect line to a top of the one of the plurality of metal interconnect lines; and
the metal oxide does not extend into an upper half of the second via.

15. The apparatus of claim 6 wherein:
a horizontal axis intersects the lateral metal interconnect; and
first, second, and third vertical axes respectively intersect the first, second, and third metal interconnect lines and each also intersect the horizontal axis.

16. The apparatus of claim 6 comprising a void between the metal oxide and one of the two sidewalls of the second via, wherein a horizontal axis intersects the second via, the void, and the metal oxide.

17. The apparatus of claim 5 comprising a processor, the processor comprising the metal layer and the additional metal layer.

18. A method comprising:
forming an interlayer dielectric (ILD) layer having a plurality of trenches formed therein, each trench having sidewalls and a bottom defined by a lower metal;
forming an insulator layer on two sidewalls and a bottom of a middle trench included in the plurality of trenches, the insulator layer covering the lower metal defining the bottom of the middle trench;
forming a mask contacting first and second sidewalls of the insulator layer such that a horizontal axis intersects the middle trench, the mask, and the first and second sidewalls of the insulator layer;
removing upper segments of the first and second sidewalls of the insulator layer such that first and second sidewall portions of the insulator layer do not extend above the mask;
removing the mask; and
depositing a fill metal in each of the trenches, the fill metal in contact with the lower metal defining the bottom of each trench, except the lower metal defining the bottom of the middle trench is isolated from the fill metal by the insulator layer.

19. The method of claim 18 comprising forming a lateral metal interconnect, included in the ILD layer, coupled to the metal fill in each of the trenches.

20. The method of claim 18 wherein:
the insulator layer has a middle portion between the first and second sidewall portions of the insulator layer; and
the middle portion has a maximum height and first and second sidewall portions of the insulator layer each have a maximum height that is greater than the maximum height of the middle portion.

* * * * *